United States Patent [19]

Yamaguchi

[11] 4,115,706
[45] Sep. 19, 1978

[54] INTEGRATED CIRCUIT HAVING ONE-INPUT TERMINAL WITH SELECTIVELY VARYING INPUT LEVELS

[75] Inventor: Tetsuo Yamaguchi, Yokohama, Japan

[73] Assignee: Tokyo Shibaura Electric Co., Ltd., Tokyo, Japan

[21] Appl. No.: 801,911

[22] Filed: May 31, 1977

[30] Foreign Application Priority Data

May 31, 1976 [JP] Japan .................... 51-63063

[51] Int. Cl.$^2$ .................. H03K 19/20; H03K 5/15
[52] U.S. Cl. .................. 307/209; 307/261; 307/269; 328/62
[58] Field of Search .......... 307/209, 213, 214, 269, 307/261; 58/23 R, 85.5; 328/62, 63

[56] References Cited

U.S. PATENT DOCUMENTS

| 3,969,633 | 7/1976 | Paluck et al. ............. 307/209 X |
| 4,031,410 | 6/1977 | Kikuchi ..................... 307/209 |
| 4,059,955 | 11/1977 | Prak ....................... 58/85.5 X |

*Primary Examiner*—John Zazworsky
*Attorney, Agent, or Firm*—Finnegan, Henderson, Farabow & Garrett

[57] ABSTRACT

An integrated circuit includes an input terminal to which a "1," "float" and "0" level input signals are selectively supplied; a clock pulse generator for generating a second clock pulse during the high level period of a first clock pulse and a third clock pulse during the low level period of the first clock pulse, and first and second latch circuits operated in response to the second and third clock pulses, respectively, of the clock pulse generator. The input terminal is connected through a resistor to the output of the first clock pulse.

The input terminal is also connected to the inputs of the first and second latch circuits. The integrated circuit generates three kinds of outputs whose logical states correspond to different levels of three input signals, respectively, which are selectively supplied to said input terminal.

6 Claims, 4 Drawing Figures

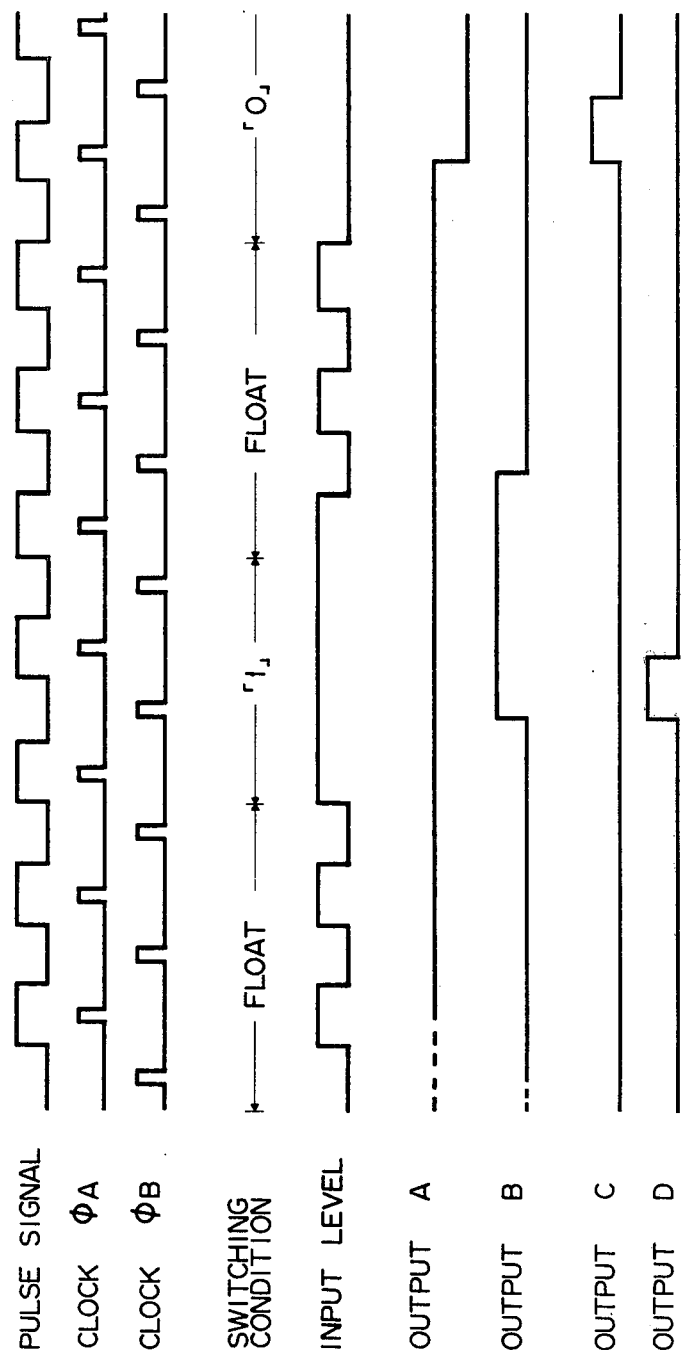

INTEGRATED CIRCUIT HAVING ONE-INPUT TERMINAL WITH SELECTIVELY VARYING INPUT LEVELS

BACKGROUND OF THE INVENTION

This invention relates to an input integrated circuit and in particular an input integrated circuit to which different kinds of input signals are selectively supplied.

In an electronic circuit technique it is customary to properly select different levels of input signals to produce different states of outputs. In an input circuit having two power sources one of which has a high level and the other of which has a low level, for example, an input terminal externally supplied with signals is connected through a resistor to either one of the power sources. Now suppose that the input terminal is connected to the low level power source and in the "pull down" state. Where it is desired to selectively generate a "1" level (for example, a positive voltage level) and a "float" level signal from the input terminal it is necessary to provide a switch for connecting the input terminal to the positive voltage level. Suppose that the input terminal is connected through the resistor to the high level power source. In this case it is required that a switch for connecting the input terminal to the negative voltage source be provided to selectively generate a "0" level (for example, a negative voltage level) and the "float" level signal. Further suppose that the input terminal is selectively connected through a changeover switch to the positive voltage source or the negative voltage source. In this case it is possible to generate a "1" level or "0" level signal from the input terminal.

According to the above-mentioned three methods two states of signals can be selectively inputted to one input terminal. In this case, however, only one input level acts actively upon, for example, a logical circuit connected to the input terminal.

Recent rapid advance of an IC technique permits a multi-function circuit to be formed on a single chip. Such a multi-function trend of the integrated circuit leads to an increase in the number of input signals and an addition of a non-integrable portion of the circuit to the chip by means of an external connection element. If external terminals of the integrated circuit are increased in number with an increase in the number of input signals a corresponding chip size becomes bulky, incurring a high cost at the "packaging" step. Therefore, a great effort must be exercised as to how much the input and output terminals or the external connection elements can be reduced in number. In the above-mentioned method one input terminal is required to generate two states of signals. In the case of the two power sources two input terminals are required to obtain three signal states which are switched through a switch. One example is an electronic watch in which three signal states are obtained by effecting a switching between the two input terminals. Generally, the electronic watch requires a supply of a plurality of input signals so as to effect a mode switching and a time correction. In this case, the transfer of input signals is effected by supplying signal levels to two input terminals by the operation of at least two switches. If a plurality of switches are so employed, inconveniences are encoutered from the point of a size and cost. There is a demand for an integrated circuit capable of a similar control by one input terminal and one switch.

SUMMARY OF THE INVENTION

It is accordingly the object of this invention to provide an input integral circuit capable of obtaining three kinds of signals by selectively supplying different levels of input signals to one input terminal.

Accordingly to this invention there is provided an input integral circuit comprising one input terminal to which different levels of input signals are selectively supplied; a clock pulse generator for generating a second clock pulse only during the "1" level period of a first clock pulse and a third clock pulse only during the "0" level period of the first clock pulse; and first and second latch circuits operated by the second and third clock pulses from the clock pulse generator, in which the input terminal is connected to the inputs of the first and second latch circuits and through a resistor to that output of the clock pulse generator where the first clock pulse is generated.

BRIEF DESCRIPTION OF THE DRAWING

This invention will be further described by way of example by referring to the accompanying drawings in which:

FIG. 2 is a time chart for explaining the operation of the integrated circuit;

DETAILED DESCRIPTION OF THE PREFERRED EMBODIMENTS

Figure 1:
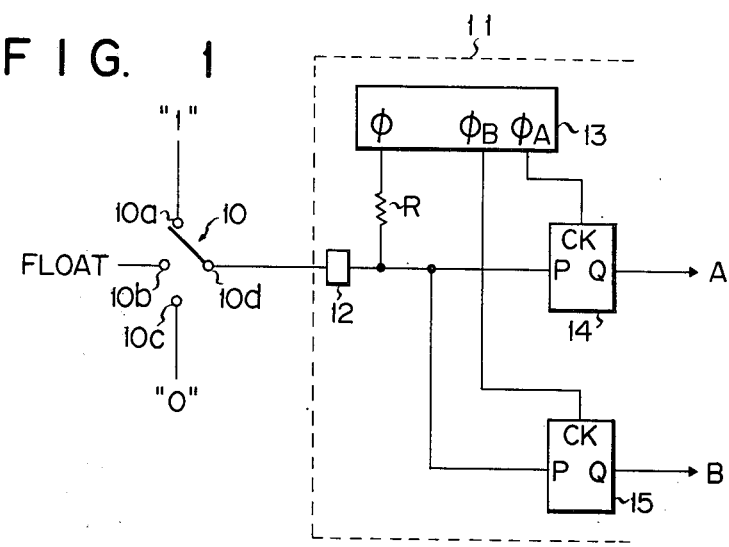
FIG. 1 is a circuit diagram showing an input integrated circuit according to one embodiment of this invention.

In FIG. 1 a three-pole changeover switch 10 has a contact 10a connected to a "1" level signal source, a contact 10b connected to a "float" level and a contact 10c connected to a "0" level signal source. A movable contact 10d of the changeover switch 10 is connected to an input terminal 12 which is built in an IC chip 11. The input terminal 12 is connected through a resistor R to that output terminal of a clock pulse generator 13 where a first clock pulse $\phi$ is generated. The input terminal 12 is also connected to input terminals P of latch circuits 14 and 15. The clock pulse generator 13 generates a first clock pulse $\phi$, a second clock pulse $\phi A$ and a third clock pulse $\phi B$. As shown in FIG. 2, the second clock pulse $\phi A$ becomes a "1" level only during a time period in which the first clock pulse $\phi$ is at the "1" level and the third clock pulse $\phi B$ becomes a "1" level only during the time period in which the first clock pulse $\phi$ is at the "0" level. The second and third clock pulses $\phi A$ and $\phi B$ are supplied to clock input terminal CK of the latch circuits 14 and 15, respectively. When in the above-mentioned circuit the movable contact 10d of the changeover switch 10 is switched to the float level contact 10b the input terminal 12 is in the "open" state and an AC level pulse signal (a pulse signal having an alternate level of "1" and "0") as indicated by a clock pulse $\phi$ in FIG. 2 appears at the input terminal 12 by the clock pulse $\phi$ which is sent from the clock pulse generator 13 through the resistor R. The latch circuits 14 and 15 connected to the input terminal 12 generate output signals A and B, as shown in FIG. 2, which are in synchronism with the clock pulses φA and φB, respectively. That is, the latch circuit 14 as driven by the clock pulse φA generates a "1" level output in response to the level "1" of the clock pulse φA and the latch circuit 15 as driven by the clock pulse φB generates a "0" level output in response to the "1" level of the clock pulse φB. When the input terminal 12 is connected to the contact 10a in the switch 10 to which the "1" level signal is supplied, the input terminals P of the latch circuits 14 and 15 are maintained at the "1" level and the latch circuits 14 and 15 generate "1" level outputs. When, on the other hand, a "0" level signal is supplied by the switching operation of the switch 10 to the input terminal 12, "0" level outputs are generated from output terminals Q of the latch circuits 14 and 15 upon receipt of the clock pulses φA and φB, respectively. In this way, the input terminal 12 is made at the "float", "1" or "0" level by the proper switching operation of the switch 10, and the outputs (A, B) of the latch circuits 14 and 15 become a (1, 0), (1, 1) or (0, 0) state according to the "float," "1" and "0" level of the input terminal 12, respectively. That is, the three output states can be obtained by varying the input level of one input terminal. This permits a decrease in number of input terminals and input circuit elements, and a consequent high order of integration, as compared with a conventional integrated circuit which requires at least two input terminals to obtain such three output states.

Figure 3:
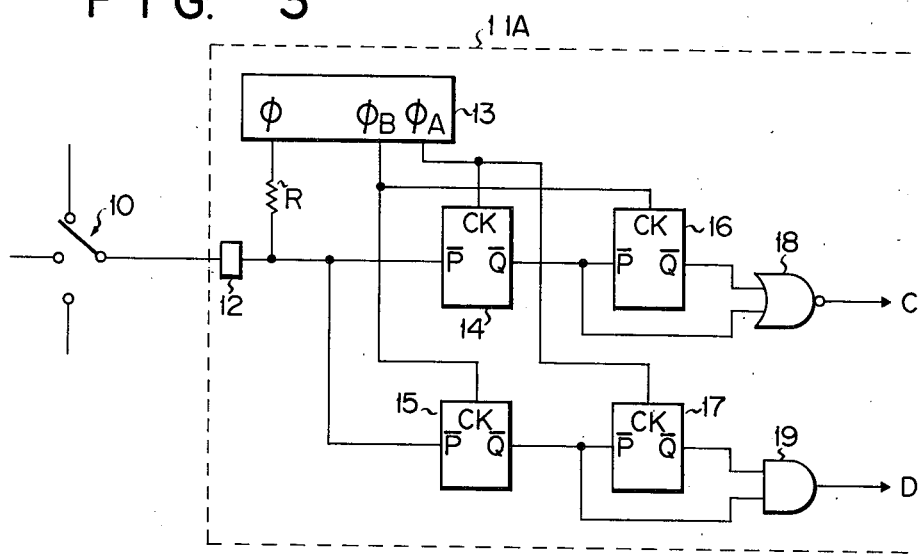
FIG. 3 is a circuit diagram showing an integrated circuit according to another embodiment of this invention.

In an integrated circuit shown in FIG. 3 the outputs A and B of the latch circuits 14 and 15 as shown in FIG. 1 are connected to input terminals $\bar{P}$ of succeeding stage latch circuits 16 and 17, respectively. A third clock pulse φB from a pulse generator 13 is supplied to an input terminal CK of one succeeding stage latch circuit 16 and a second clock pulse φA from the pulse generator 13 is supplied to the other succeeding stage latch circuit 17. The output terminals Q and $\bar{Q}$ of the latch circuits 14 and 16, respectively, are connected to the inputs of a NOR gate 18 and the output terminals Q and $\bar{Q}$ of the latch circuits 15 and 17 are connected to the inputs of an AND gate 19. Since in the integrated circuit shown in FIG. 3 the latch circuit 16 is driven by the clock pulse φB which is phase-lagged with respect to the clock pulse φA supplied to the latch circuit 14, the succeeding stage latch circuit 16 generates an output, which is phase-delayed with respect to the output A of the latch circuit 14. In consequence, when the output A of the latch circuit 14 is shifted from a "1" to a "0" level, a one-shot output signal C as shown in FIG. 2 is generated from the NOR gate 18. Likewise, the latch circuit 17 is driven by the clock pulse φA which is phase-delayed with respect to the clock pulse φB supplied to the latch circuit 15, and when the output B of the latch circuit 15 is shifted from a "0" to a "1" level a one-shot signal D is generated from the AND gate 19. That is, in the integrated circuit shown in FIG. 3 the one-shot signal C is generated when the input terminal 12 is shifted from the "float" to the "0" level and the one-shot signal D is generated when the input terminal 12 is shifted from the "float" to the "1" level.

When the output of the integrated circuit in FIGS. 1 and 3 is supplied as an input signal to a logic circuit device, the logic circuit device is controlled to a desired state by the switching operation of the switch 10.

Figure 4:
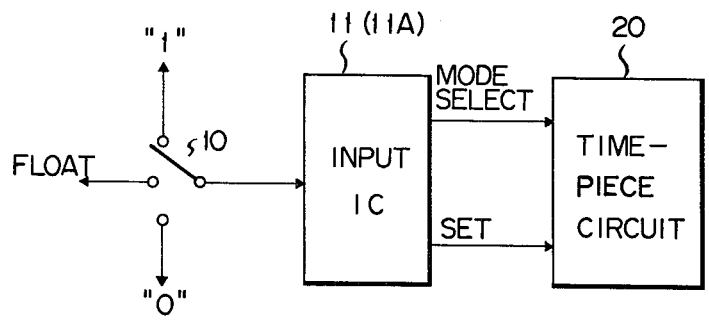
FIG. 4 is a block diagram in which the integrated circuit according to this invention is applied to an electronic timepiece.

Explanation will now be given by way of example to the case where this invention is applied to an electronic timepiece as shown in FIG. 4.

An ordinary electronic timepiece has a time counting function such as an hour, minute, second and date counting function and when, for example, a power source of a battery is incorporated into the electronic timepiece, it is necessary to correct a time display. In a conventional timepiece, at least two switches are required to (1) select a digit to be corrected and (2) effect a corresponding step count. In the integrated circuit shown in FIG. 3, for example, both the functions (1) and (2) can be performed using only one input terminal. That is, the output C can be used to select a digit to be corrected and the output D can be used to effect a corresponding step count. When the "float" level is selected by the switch 10, the timepiece effects a normal time counting operation. Each time the switch 10 is set from the "float" level to the "0" level a one-shot signal appears on the output line C and for said each time the digit to be corrected is selected for a normal mode → a second correction → a minute correction → an hour correction → a data correction, etc. When a step count operation and return-to-zero operation are effected for each digit, the corresponding digit is stepwise counted each time the switch 10 is set in each correction mode from the "float" to the "1" level.

As mentioned above, the three output states are obtained by varying the input level of one input terminal 12 by the switching operation of one changeover switch 10. If therefore, this invention is applied to a multi-function electronic circuit, the associated input terminals and operating means can be reduced in number, resulting in a high order of integration and a consequent compactness.

Although in the above-mentioned embodiment the clock pulses φA, φB from the clock pulse generator have the same frequency as the fundamental clock pulse φ, for example, φA may be equal to φ and φB be equal to $\bar{\phi}$. The cycle of these clock pulses may be an integral multiple of the clock pulse φ.

What is claimed is:

1. An input integral circuit comprising one input terminal to which different levels of input signals are selectively supplied; a clock pulse generator having a first, a second and a third output from which a first, a second and a third clock pulse are generated respectively; a resistor connected between said input terminal and said first output of said clock pulse generator; and an output circuit portion at least including a first latch circuit having an input connected to said input terminal and a clock input connected to said second output of said clock pulse generator and a second latch circuit having an input connected to said input terminal and a clock input connected to said third output of said clock pulse generator, in which said output circuit portion generates outputs whose logical states correspond to different levels of input signals, respectively, which are selectively supplied to said input terminal.

2. An input integral circuit according to claim 1, in which said first, second and third clock pulses of said clock pulse generator are in such a relation that said second clock pulse is generated during a time period in which said first clock pulse is at a high level and that said third clock pulse is generated during a time period in which said first clock pulse is at a low level.

3. An input integral circuit according to claim 1, in which said output circuit portion further includes third and fourth latch circuits connected to said first and second latch circuits to which said second and third clock pulses are supplied, respectively, a NOR gate having inputs connected to outputs of said first and third latch circuits; and an AND gate having inputs connected to outputs of said second and fourth latch circuits, in which said third and fourth latch circuits are driven by said third and second clock pulses from said clock pulse generator.

4. An input integral circuit according to claim 3, in which said second and third clock pulses are generated in a manner to have a mutually different phase.

5. An input integral circuit comprising one input terminal to which three different levels of input signals are selectively supplied; a clock pulse generator having a first, a second and a third output from which a first, a second and a third clock pulse are generated respectively; a resistor connected between said input terminal and said first output of said clock pulse generator; and an output circuit portion at least including a first latch circuit having an input connected to said input terminal and a clock input connected to said second output of said clock generator and a second latch circuit having an input connected to said input terminal and a clock input connected to said third output of said pulse generator, in which said output circuit portion generates selectively outputs whose three logical states correspond to three different levels of input signals, respectively, which are selectively supplied to said input terminal.

6. An input integral circuit according to claim 5 wherein said three different levels of input signals are "1" level, "float" level and "0" level, respectively.

* * * * *